United States Patent [19]

Kimura et al.

[11] Patent Number: 5,239,224
[45] Date of Patent: Aug. 24, 1993

[54] PIEZOELECTRIC ACTUATOR CONNECTED TO FLEXIBLE CABLES

[75] Inventors: Daisuke Kimura; Shyuichi Yamaki, both of Kawasaki, Japan

[73] Assignee: Fujitsu Limited, Kanagawa, Japan

[21] Appl. No.: 977,026

[22] Filed: Nov. 16, 1992

[30] Foreign Application Priority Data

Nov. 19, 1991 [JP] Japan .................. 3-303033

[51] Int. Cl.⁵ .............................. H01L 41/08
[52] U.S. Cl. ........................ 310/328; 310/366
[58] Field of Search ............ 310/328, 334–337, 310/321–325; 439/178, 190, 203; 400/124; 101/93.5

[56] References Cited

U.S. PATENT DOCUMENTS

| | | | |
|---|---|---|---|
| 5,005,994 | 4/1991 | Yano | 400/124 |
| 5,078,520 | 1/1992 | Yano et al. | 400/124 |
| 5,092,689 | 3/1992 | Yano | 400/124 |

FOREIGN PATENT DOCUMENTS 57-25797 2/1982 Japan .
63-89351 4/1988 Japan .
1-228182 9/1989 Japan .
3-104290 5/1991 Japan .

*Primary Examiner*—Mark O. Budd
*Attorney, Agent, or Firm*—Armstrong, Westerman, Hattori, McLeland & Naughton

[57] ABSTRACT

A piezoelectric actuator having a significantly strong coupling between each of its external electrodes and the matching flexible cable. This piezoelectric actuator comprises a ceramic layer body made of a large number of piezoelectric ceramic layers stacked to a predetermined depth; a plurality of internal electrodes sandwiched between the ceramic layers; a pair of external electrodes, the first electrode connecting every other one of the internal electrodes, the second electrode connecting every second internal electrode not connected to the first external electrode; and a pair of flexible cables connected to edges of the external electrodes. The external electrodes are soldered to the flexible cables. Upon soldering, a metal intervening member is inserted in a hole made on the coupling part of each flexible cable. Soldering the intervening member provides a strongly soldered coupling between external electrode and flexible cable.

3 Claims, 3 Drawing Sheets

PIEZOELECTRIC ACTUATOR CONNECTED TO FLEXIBLE CABLES

BACKGROUND OF THE INVENTION

1. Field of the Invention

The present invention relates to improvements of a piezoelectric actuator for use with wire-dot impact printers and other equipment.

2. Description of the Related Art

The enhanced printing speeds of wire-dot impact printers in recent years have been accompanied by the growing use of piezoelectric actuators that drive print wires at the print head. The piezoelectric actuator comprises a plurality of piezoelectric ceramic layers, a plurality of internal electrodes, and a pair of external electrodes for connecting the internal electrodes. Driven on a high voltage under severe operating conditions, the actuator is required to be highly reliable.

FIG. 1 is a perspective view of a typical prior art piezoelectric actuator. In FIG. 1, a piezoelectric actuator 2 has a ceramic layer body 5 made of a large number of piezoelectric ceramic layers 4 sandwiching internal electrodes 6 therebetween; a first external electrode 8 attached to one side of the ceramic layer body 5 and connecting every other internal electrode 6; and a second external electrode, not shown, attached to the opposite side of the first external electrode 8 and connecting every second internal electrode not connected to the first external electrode 8. Reference numeral 10 is a half-column shaped insulation layer that allows each internal electrode 6 to be connected to either of the first and the second external electrodes in an alternating manner. In other words, the insulation layer 10 is formed between each internal electrode 6 connected electrically to either the first or the second external electrode and the other unconnected external electrode. The first external electrode, which is positive in polarity, is connected via a flexible cable 12 to the positive terminal of a driving circuit, not shown. The second external electrode, which is negative in polarity, is connected to ground via a flexible cable 14.

A ceramic layer 4a at the bottom of the ceramic layer body 5 is fixedly attached to a base. When the internal electrodes 6 are supplied with a predetermined driving voltage via the flexible cables 12, 14 and the external electrodes, the laminated piezoelectric ceramic layers 4 extend. Because the piezoelectric ceramic layer 4a at the bottom is secured to the base, a piezoelectric ceramic layer 4b at the top elongates upward aided by the cumulative extension of the piezoelectric ceramic layers 4 thereunder.

How the prior art external electrodes are coupled to the flexible cables will now be described with reference to FIG. 2. Above the piezoelectric ceramic layer 4a is an external electrode land 16 attached to an edge of the external electrode 8. The external electrode land is made of a solder piece that attaches to ceramics. A hole 19 is formed at the coupling of the flexible cable 12. Around the hole 19 is a circular land 18. With the circular land 18 of the flexible cable 12 brought into contact with the external electrode land 16, solder 20 is used to fill the hole 19 so that the flexible cable 12 will be soldered to the external electrode land 16.

One disadvantage of the above prior art coupling structure is that heat is not sufficiently transmitted to the contact portion between the external electrode land 16 and the circular land 18 of the flexible cable 12 upon soldering. As a result, the strength of the soldered coupling is not very high. When the piezoelectric actuator 2 is driven by pulses, the resulting vibration can dislodge the inadequate coupling between the flexible cables 12 and 14 on the one hand and the external electrodes on the other.

SUMMARY OF THE INVENTION

It is therefore an object of the present invention to provide a piezoelectric actuator which is highly reliable through the provision of a strong coupling between flexible cables and external electrodes.

In accordance with an aspect of the present invention, there is provided a piezoelectric actuator comprising: a plurality of piezoelectric ceramic layers laminated and having a first and a second side; a plurality of internal electrodes sandwiched between the plurality of piezoelectric ceramic layers; a first external electrode, formed on the first side of the plurality of piezoelectric ceramic layers, for connecting every other one of the plurality of internal electrodes; a second external electrode, formed on the second side of the plurality of piezoelectric ceramic layers, for connecting every second one of the plurality of internal electrodes which is not connected to the first external electrode; a first external electrode land formed on the first side of the plurality of piezoelectric ceramic layers and coupled to an edge of the first external electrode; a second external electrode land formed on the second side of the plurality of piezoelectric ceramic layers and coupled to an edge of the second external electrode; a first flexible cable soldered to the first external electrode land, the soldering part of the first flexible cable having a first land with a hole formed thereon, the hole having a first metal intervening member caulked therein; and a second flexible cable soldered to the second external electrode land, the soldering part of the second flexible cable having a second land with a hole formed thereon, the hole having a second metal intervening member caulked therein.

In a preferred structure according to the invention, the metal intervening member caulked in the hole of the land formed on the soldering part of the flexible cable may be replaced by a collared metal intervening member that is press-fit into the hole.

According to the invention, each external electrode is soldered to the matching flexible cable via the metal intervening member. This arrangement allows sufficient heat to reach the contact portion between the external electrode land and the circular land of the flexible cable upon soldering, thereby enhancing the strength of the soldered coupling.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Some preferred embodiments of the invention will now be described with reference to the accompanying drawings.

Figure 1:
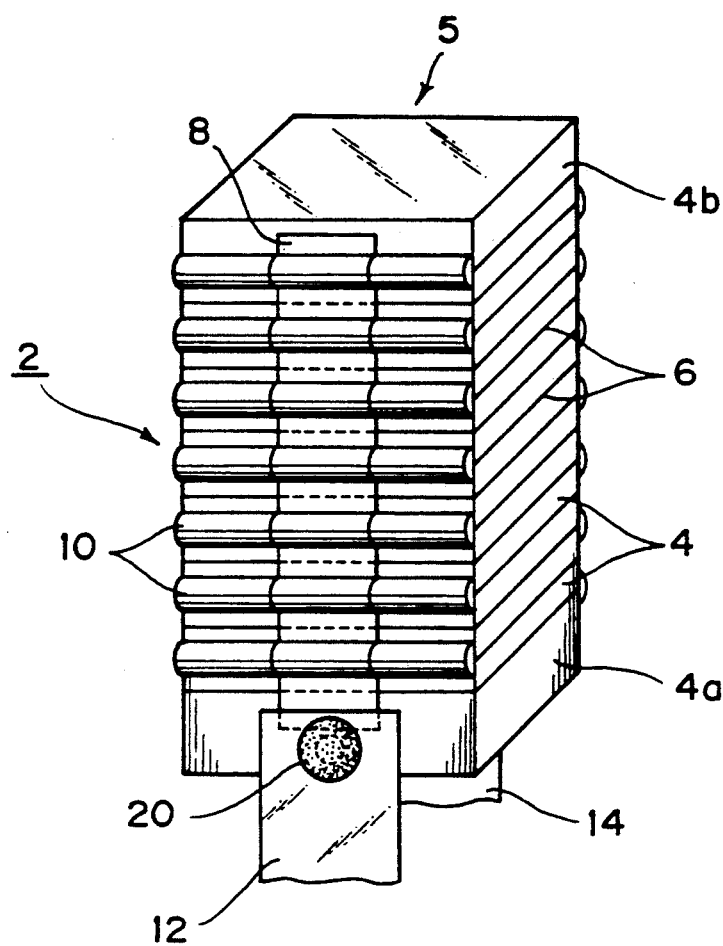
FIG. 1 is a perspective view of a typical prior art piezoelectric actuator.
Figure 2:
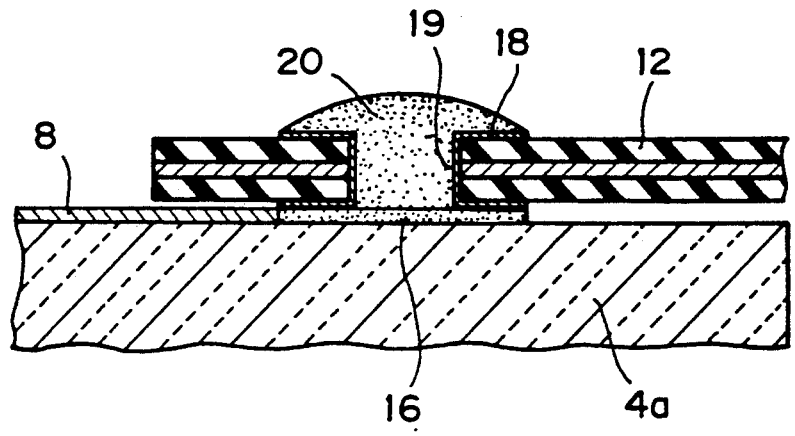
FIG. 2 is a cross-sectional view of a coupling structure between an external electrode and a flexible cable in connection with the prior art piezoelectric actuator.
Figure 3:
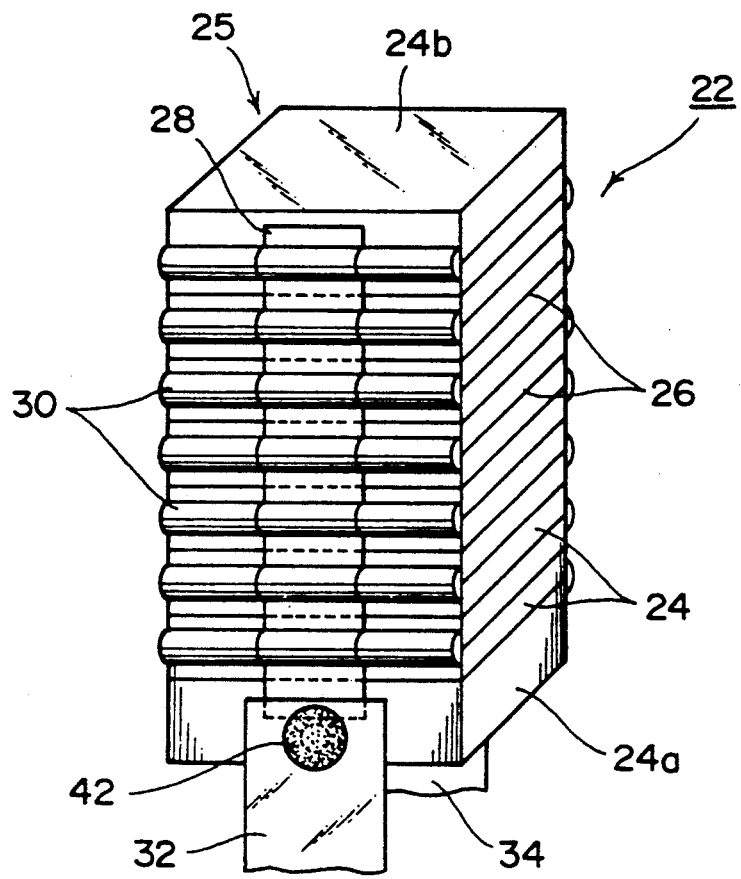
FIG. 3 is a perspective view of a piezoelectric actuator similar to that of FIG. 1 and embodying the invention.

FIG. 3 shows a piezoelectric actuator 22 similar to the piezoelectric actuator 2 of FIG. 1. The piezoelectric actuator 22 comprises a ceramic layer body 25 made of a large number of piezoelectric ceramic layers 24 sandwiching internal electrodes 26 therebetween; a first external electrode 28, formed on one side of the ceramic layer body 25, for connecting every other one of the multiple internal electrodes 26; a second external electrodes, not shown and formed on the opposite side of the first external electrode 28, for connecting every second one of the internal electrodes 26 which is not connected to the first external electrode 28; and flexible cables 32 and 34 connected to the external electrodes.

The ceramic layer body 25 is made of a plurality of piezoelectric ceramic green sheets each having one side thereof covered with a metal paste film acting as an internal electrode. Upon manufacture, the green sheets are baked at a predetermined high temperature for a predetermined period of time. The external electrode 28 is made of a conductive material that is silk-screen-printed on one side of the ceramic layer body 25 and baked thereto. As mentioned, every other internal electrode 26 is connected either to the first external electrode 28 or to the second external electrode, the remaining electrodes 26 being connected to the other external electrode. Each internal electrode 26 has a half-column type insulating body 30 formed on its unconnected portion.

The first external electrode 28, which is positive in polarity, is connected to the positive terminal of a driving circuit, not shown, via the flexible cable 32. The second external electrode 26, which is negative in polarity, is connected to ground via the flexible cable 34.

The piezoelectric actuator 22 is used as follows: A ceramic layer 24a at the bottom of the ceramic layer body 25 is bonded to a base. When a predetermined driving voltage is applied to the internal electrodes 26 via the flexible cables 32, 34 and the external electrodes, each piezoelectric ceramic layer 24 extends. Because the ceramic layer 24a at the bottom is secured to the base, a ceramic layer 24b at the top elongates upward supported by the cumulative extension of the piezoelectric ceramic layers 24 thereunder. Where a print wire is connected to the ceramic layer 24b at the top with a displacement amplifying mechanism interposed therebetween, that print wire is driven by the piezoelectric actuator 22 in accordance with the voltage signal supplied.

Figure 4:
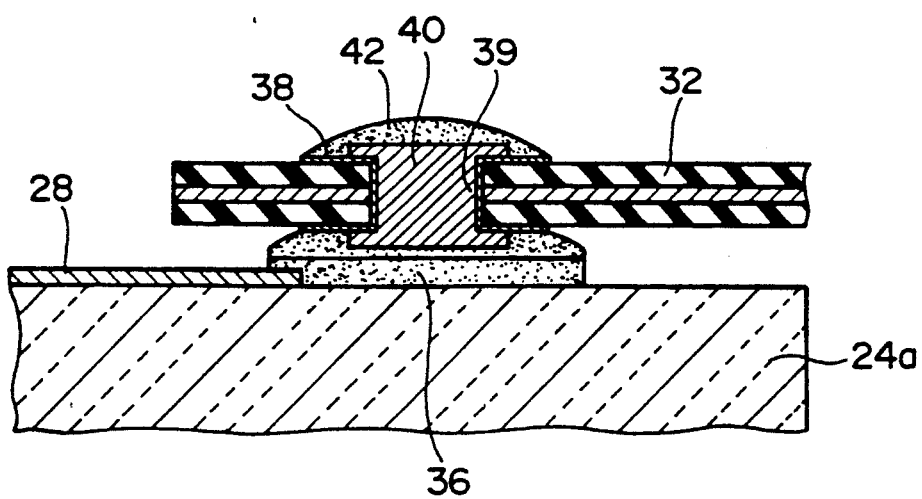
FIG. 4 is a cross-sectional view of a coupling structure between an external electrode and a flexible cable in connection with the embodiment of FIG. 3.

Described below with reference to FIG. 4 is the coupling structure between the external electrode 28 and the flexible cable 32 in connection with the piezoelectric actuator of FIG. 3. On top of the piezoelectric ceramic layer 24a is an external electrode land 36 connected to an edge of the external electrode 28. The external electrode land 36 is formed illustratively from a solder piece that attaches to ceramics. If ordinary solder is utilized, the external electrode land 36 is formed by soldering after the necessary part of the piezoelectric ceramic layer 24a has been metalized. The coupling part of the flexible cable 32 has a hole 39. The inner wall of the hole 36 and the top and bottom sides around the hole are covered with a circular land 38.

Figure 5:
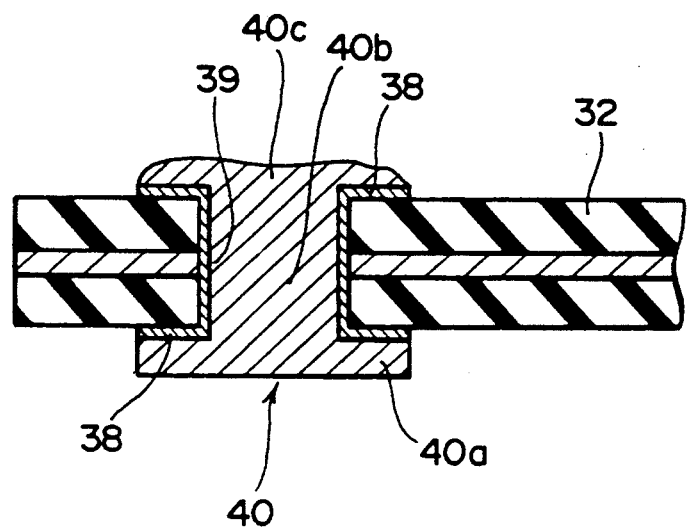
FIG. 5 is an enlarged cross-sectional view of the flexible cable for use with the embodiment.

As best shown in FIG. 5, an intervening member 40 is caulked inside the hole 39 of the flexible cable 32. The intervening member 40 is made of an electrically and thermally conductive metal material such as copper. The intervening member 40 looks like a rivet having a collar 40a and a shaft 40b and solder-plated in advance. For use, the shaft 40b of the intervening member 40 is inserted in the hole 39 of the flexible cable 32. Caulking its edge 40c opposite to the collar 40a secures the intervening member 40 to the flexible cable 32.

The flexible cable 32 is coupled to the external electrode land 36 as follows: The collar 40a or the caulked edge 40c of the intervening member 40 fixed to the flexible cable 32 is brought into contact with the external electrode land 36. Then a piece of solder 42 is applied to the contact surface from the opposite side thereof using a heated soldering iron. The heat of the soldering iron propagates quickly through the intervening member 40 to the external electrode land 36, thereby melting the land 36. The melted solder of the external electrode land 36 mixes integrally with the newly applied solder 42, forming a strongly soldered part.

Figure 6:
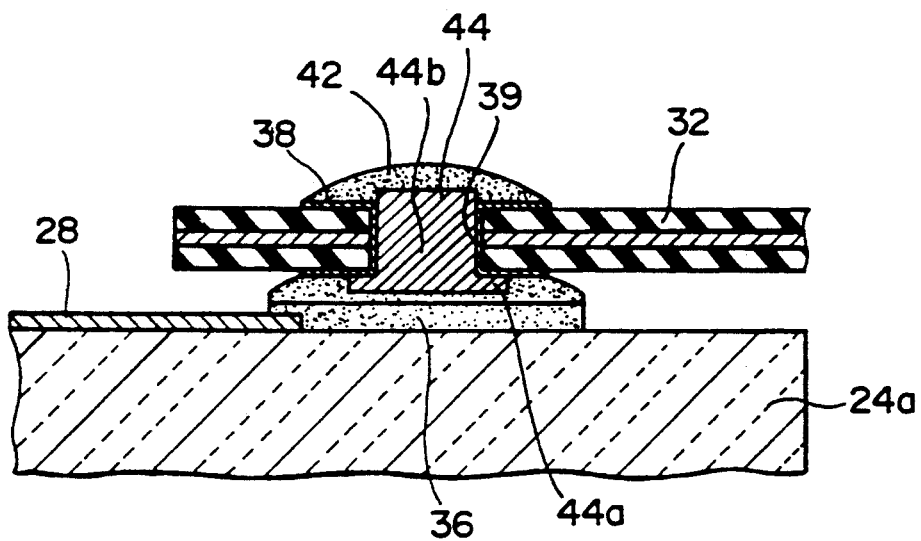
FIG. 6 is a cross-sectional view of another coupling structure between an external electrode and a flexible cable for use with another embodiment of the invention.

FIG. 6 is a cross-sectional view of another coupling structure between the external electrode 28 and the flexible cable 32 for use with another embodiment of the invention. With this embodiment, the shaft 44b of an intervening member 44 has a diameter slightly greater than that of the hole 39 of the flexible cable 32. With a collar 44a facing the external electrode land 36, the intervening member 44 is press-fit into the hole 39. In that press-fit state, the flexible cable 32 is soldered to the external electrode land 36. Using this intervening member 44 enhances the ease and security of attaching the external electrode 28 to the flexible cable 32.

In the coupling structure of FIG. 6, the shaft 44b of the intervening member 44 is preferably knurled. This helps to keep the intervening member 44 in place while the member is being transported to the soldering process.

As many apparently different embodiments of this invention may be made without departing from the spirit and scope thereof, it is to be understood that the invention is not limited to the specific embodiments thereof except as defined in the appended claims.

What is claimed is:

1. A piezoelectric actuator comprising:
    a plurality of piezoelectric ceramic layers laminated and having a first and a second side;
    a plurality of internal electrodes sandwiched between said plurality of piezoelectric ceramic layers;
    a first external electrode, formed on said first side of said plurality of piezoelectric ceramic layers, for connecting every other one of said plurality of internal electrodes;
    a second external electrode, formed on said second side of said plurality of piezoelectric ceramic layers, for connecting every second one of said plurality of internal electrodes which is not connected to said first external electrode;

a first external electrode land formed on said first side of said plurality of piezoelectric ceramic layers and coupled to an edge of said first external electrode;

a second external electrode land formed on said second side of said plurality of piezoelectric ceramic layers and coupled to an edge of said second external electrode;

a first flexible cable soldered to said first external electrode land, the soldering part of said first flexible cable having a first land with a hole formed thereon, said hole having a first metal intervening member caulked therein; and a second flexible cable soldered to said second external electrode land, the soldering part of said second flexible cable having a second land with a hole formed thereon, said hole having a second metal intervening member caulked therein.

2. A piezoelectric actuator comprising:

a plurality of piezoelectric ceramic layers laminated and having a first and a second side;

a plurality of internal electrodes sandwiched between said plurality of piezoelectric ceramic layers;

a first external electrode, formed on said first side of said plurality of piezoelectric ceramic layers, for connecting every other one of said plurality of internal electrodes;

a second external electrode, formed on said second side of said plurality of piezoelectric ceramic layers, for connecting every second one of said plurality of internal electrodes which is not connected to said first external electrode;

a first external electrode land formed on said first side of said plurality of piezoelectric ceramic layers and coupled to an edge of said first external electrode;

a second external electrode land formed on said second side of said plurality of piezoelectric ceramic layers and coupled to an edge of said second external electrode;

a first flexible cable soldered to said first external electrode land, the soldering part of said first flexible cable having a first land with a hole formed thereon, said hole having a first collared metal intervening member press-fit therein; and a second flexible cable soldered to said second external electrode land, the soldering part of said second flexible cable having a second land with a hole formed thereon, said hole having a second collared metal intervening member press-fit therein.

3. A piezoelectric actuator according to claim 2, wherein said first collared metal intervening member and said second collared metal intervening member have a knurled shaft each, said knurled shaft being press-fit in said hole.

* * * * *